United States Patent [19]

Burns et al.

[11] 4,431,707

[45] Feb. 14, 1984

[54] PLATING ANODIZED ALUMINUM SUBSTRATES

[75] Inventors: Richard W. Burns, Round Rock; Issa S. Mahmoud, Austin, both of Tex.

[73] Assignee: International Business Machines Corporation, Armonk, N.Y.

[21] Appl. No.: 453,022

[22] Filed: Dec. 27, 1982

[51] Int. Cl.$^3$ ..................... C25D 5/44; C25D 11/16
[52] U.S. Cl. ................................. 428/629; 428/632; 428/648; 428/675; 204/33; 204/38 A; 204/30; 427/304
[58] Field of Search .................. 204/38 A, 35 N, 42, 204/30, 33; 427/304, 328; 428/469, 901, 629, 632, 648, 675

[56] References Cited

U.S. PATENT DOCUMENTS

| | | | |
|---|---|---|---|
| 2,905,600 | 9/1959 | Franklin | 204/42 |
| 3,674,658 | 7/1972 | Van Asperen et al. | 204/30 |
| 3,725,108 | 4/1973 | Saubestre et al. | 204/30 X |
| 3,914,126 | 10/1975 | Pinsler | 204/38 A X |
| 3,943,039 | 3/1976 | Wittrock | 204/42 |
| 4,100,038 | 7/1978 | Jongkind | 204/33 X |
| 4,211,619 | 7/1980 | Usbeck | 204/38 A X |

OTHER PUBLICATIONS

"The Surface Treatment and Finishing of Aluminium and its Alloys", Wernick and Pinner, Third Edition, 1964, p.: Title, XXVI, XXVII, 594–606.

American Electroplaters Society Research Project 41, "Adhesion Failure of Electrodeposited Coatings on Anodized Aluminum Alloys," Thomas, Oct. 1982.

"Phosphoric Acid Anodize as Pre-Plate Treatment for Aluminum,"0 Wittrock, Annual Technical Conference AES 66, Jun. 24–28.

*Primary Examiner*—G. L. Kaplan
*Assistant Examiner*—Nam X. Nguyen
*Attorney, Agent, or Firm*—Andrea P. Bryant

[57] ABSTRACT

Nickel and copper and plated over a thick anodic coating on an aluminum substrate as a step in the manufacture of printed circuit board substrates.

9 Claims, No Drawings

PLATING ANODIZED ALUMINUM SUBSTRATES

CROSS REFERENCES TO RELATED APPLICATION

U.S. patent application, Ser. No. 452,993, filed Dec. 27, 1982 concurrently herewith, entitled "Sealing Thick Anodic Coatings on Aluminum Substrates", having I. S. Mahmoud as inventor and commonly assigned.

DESCRIPTION

1. Technical Field

This invention relates to a process for plating copper on hard anodized aluminum substrates.

2. Background Art

Prior art shows that plating of aluminum and its alloys reveals that porous anodizing has been extensively investigated as a surface pre-treatment. For example, U.S. Pat. No. 3,943,039 to Wittrock teaches an anodizing step before plating with nickel. Wernick and Pinner, in *Surface Treatment of Aluminum*, discuss plating methods in which anodizing is used as a pre-treatment step. In the October 1982 issue of the American Electroplaters Society Journal, *Plating and Surface Finishing*, David E. Thomas, Page 57, discusses the use of anodizing as pre-treatment to plating, in an article entitled "Adhesion Failure of Electrodeposited Coatings on Anodized Aluminum Alloys."

All of the above-referenced art relates only to thin anodic coatings. Such thin coatings usually use phosphoric acid anodizing. The resulting coating is not a good insulator, and with sufficient current density, electrodeposition is possible.

More recently, anodized aluminum has been investigated as a di-electric material for use in electronic packaging. Metalization of thick anodic coatings is known to be achieved by lamination of copper foils followed by etching. Such a process limits utilization of anodized substrates to one sided circuit board applications.

Many processes are known for plating aluminum and aluminum alloys in the raw oxidized and anodized states. Anodized aluminum plating has been limited to relatively thin coatings of up to 0.051 milimeters (0.002 inch) thickness. These coatings are porous and with proper plating conditions, certain metals may be plated onto the coating without surface conditioning.

Thick coatings, over 0.1 milimeters (0.024 inch and above) are non-conductive and direct plating to these coatings has been heretofore unattainable.

DISCLOSURE OF INVENTION

The present invention provides a significantly lower cost packaging alternative with good heat dissipation properties resulting from an improved process for plating thick anodic coatings on aluminum substrates. We provide a novel pre-treatment formulation which is significantly faster. An aluminum work piece is anodized to form a thick anodic coating. The work piece is then sensitized and etched at room temperature for two minutes in a solution comprised of stannous chloride, hydrochloric acid and water. Following a distilled water rinse, the work piece is activated in a solution containing palladium chloride and hydrochloric acid. The activation step is followed by another rinse in distilled water. The result is a substrate which is plated first with an electroless nickel bath then followed by electrolytic plating in a conventional acid copper bath.

Plating over thick anodic coatings, whether electroless or electrolytic solutions are used, is possible after our sensitizing and activating steps.

BEST MODE FOR CARRYING OUT THE INVENTION

The following example illustrates the practice of this invention and includes the following steps:
(a) Hard anodize;
(b) seal;
(c) sensitize and etch in a solution consisting of:
stannous chloride ($SnCl_2 \cdot 4H_2O$) 40 g/l
hydrochloric acid (HCl, 36%) 60 ml/l
water 1 liter;
(d) rinse in distilled water;
(e) activate in the solution of 0.25 grams palladium chloride, ($PdCl_2$); hydrochloric acid, HCl., 36%, 2.5 ml;
(f) rinse in distilled water;
(g) plate in an electroless nickel bath for 5–10 minutes;
(h) plate in acidic copper bath at 1–2 amp/$dm^2$ current density; voltage 1–2 volt; temperature of 21°–27° C. (70°–80° F.).

It is to be noted that the plating time for copper is a function of the desired coating thickness. The following mathematical relationship relates time and thickness.

$$\text{time (hours)} = \frac{144 \times t \times 16.4 \times \text{Sp. Gr.} \times 100}{1000 \times \text{g/amp-hour} \times C.D. \times C.\textit{Eff.}}$$

where
t = thickness in mil;
Sp.Gr. = Specific Gravity — 8.95 for copper;
g/amp−hour = 1.182 for copper;
C.D. = Current density (1–2 amp.$dm^2$);
C.Eff. = Current efficiency = 95% for acid copper bath.

The preferred sealing step is described in detail in co-pending, commonly assigned, U.S. patent application, Ser. No. 452,992.

We claim:

1. A method of preparing aluminum work pieces having sealed, thick anodic coatings thereon, for plating including the following steps:
sensitizing the surface of the work piece in a solution of $SnCl_2$ and HCl; and
activating said surface in a solution containing $PdCl_2$ and HCl.

2. The method of claim 1 wherein the surface is also etched by said solution during said sensitizing step, the sensitizing step is also an etching step, occurring in a solution comprising $SnCl_2$ and HCl.

3. The method of claim 2 wherein said sensitizing and etching solution has 40 g per liter of stannous chloride and 60 mililiters per liter of 36% hydrochloric acid in 1 liter of water.

4. The method of claim 1 wherein the activating step solution contains 0.25 g $PdCl_2$ per 2.5 mililiters of 36% hydrochloric acid.

5. A method of preparing aluminum substrates for utilization as printed circuit board substrates comprising the following steps:
(a) hard anodizing;
(b) sealing;
(c) sensitizing and etching;
(d) rinsing;
(e) activating;
(f) rinsing;
(g) plating.

6. A substrate for printed circuit boards made in accordance with the method of claim 5.

7. The method of claim 5 wherein the sensitizing and etching step occurs in a solution comprising stannous chloride, hydrochloric acid and water.

8. The method of claim 5 wherein the activating step occurs in a solution of palladium chloride and hydrochloric acid.

9. The method of claim 5 wherein plating step is done in two stages comprising:
   first, electrolessly plating in a nickel bath for 5–10 minutes and then electrolytically plating in an acidified copper bath.

* * * * *

UNITED STATES PATENT AND TRADEMARK OFFICE
CERTIFICATE OF CORRECTION

PATENT NO. : 4,431,707
DATED : 14 February 1984
INVENTOR(S) : R. W. Burns et al

It is certified that error appears in the above—identified patent and that said Letters Patent is hereby corrected as shown below:

In the abstract, line 1, delete "and", second occurrence, and insert --are--.

Signed and Sealed this

Nineteenth Day of June 1984

[SEAL]

Attest:

Attesting Officer

GERALD J. MOSSINGHOFF
Commissioner of Patents and Trademarks